United States Patent
Chen

(10) Patent No.: US 8,159,239 B2
(45) Date of Patent: Apr. 17, 2012

(54) TESTING APPARATUS FOR TESTING ELECTRONIC SYSTEM WITH 5-WIRE RESISTIVE TOUCH PANEL AND THE METHOD THEREFOR

(75) Inventor: Chang-Yi Chen, Bade (TW)

(73) Assignee: IdeaCom Technology Corporation, Hsin Tien, Taipei County (TW)

( * ) Notice: Subject to any disclaimer, the term of this patent is extended or adjusted under 35 U.S.C. 154(b) by 383 days.

(21) Appl. No.: 12/591,186

(22) Filed: Nov. 12, 2009

(65) Prior Publication Data
US 2010/0127713 A1 May 27, 2010

(30) Foreign Application Priority Data
Nov. 21, 2008 (TW) ................ 97145092 A

(51) Int. Cl.
*G01R 31/26* (2006.01)

(52) U.S. Cl. ............................. 324/713; 324/760.01
(58) Field of Classification Search .................. None
See application file for complete search history.

(56) References Cited

U.S. PATENT DOCUMENTS
7,852,065 B2 * 12/2010 Chen .......................... 324/537
* cited by examiner

*Primary Examiner* — Minh N Tang
(74) *Attorney, Agent, or Firm* — Bacon & Thomas, PLLC

(57) ABSTRACT

The invention relates to a testing apparatus for testing a 5-wire resistive touch panel of an electronic system. The testing apparatus comprises a voltage control unit, a signal control unit, an electronic unit and a determining unit. The electronic unit is used for generating at least one output signal corresponding to a first voltage level and a second voltage level generated by the voltage control unit and a detecting signal generated by the signal control unit. The determining unit coupled to the electronic unit is used for determining the status of the electronic unit according to the at least one output signal.

17 Claims, 7 Drawing Sheets

TESTING APPARATUS FOR TESTING ELECTRONIC SYSTEM WITH 5-WIRE RESISTIVE TOUCH PANEL AND THE METHOD THEREFOR

BACKGROUND OF THE INVENTION

1. Field of the Invention

The invention is related to a testing apparatus and a method for testing an electronic system, and more specifically is related to a testing apparatus and a method for testing the connection of a 5-wire resistive touch panel of the electronic system.

2. Description of the Prior Art

Various kinds of touch sensing technology are used in many different electronic products in recently years for their progressive in better quality and more convenient. A touch pad is implemented in various kinds of electronic products because it has advantages in size small, cost less, power low and life durable.

No matter what kinds of electronic products, they need to pass the standard functional test before being sold to customers. Please referring to FIG. 1, FIG. 1 is a schematic diagram of an electronic system with a 5-wire resistive touch panel. As shown in FIG. 1, an electronic system with a touch panel comprises two portions which are a touch panel 12 and a control module 14 respectively. The touch panel 12 is used for receiving the pressing operation executed by a user and the control module 14 is used for detecting the pressing operation and further executing the corresponding function according to the detected result. The touch panel 12 includes two layers which are a lower layer panel 121 and an upper layer panel 123. The lower layer panel 121 is used for receiving the detecting signals and power related to the touch operation via terminals UL, LL, UR and LR. The upper layer 123 is used for detecting the pressing position on the touch panel pressed by the user, accordingly transmitting the detected signals to the control module 14 via WIPER terminal and then determining the corresponding operation according to the received signals by the control module 14 to generate a corresponding execution.

Therefore, when testing the function of the 5-wire resistive touch panel 12 of the electronic system, the user not only needs to test the touch panel 12 and the control module 14 respectively, but the connection between the touch panel 12 and the control module 14 is also an important item needed to be tested.

In general, the testing of the connection between the touch panel 12 and the control module 14 of the electronic system is executed in a manual manner. If the circuit inside the electronic system is connected according to a standard manner and there is no short circuit, open circuit or any other problem with the circuit, the control module 14 detects the corresponding signal which represents the connection is normal. If not, it represents that the connection is abnormal. When the electronic system passes the connection test, it also needs to pass other tests in sequence to make sure the quality of the electronic system before being sold.

In consideration of convenience and efficiency, the testing in manual manner costs a lot of human sources and time in testing the connection between the touch panel and the electronic system. It also has disadvantages in slow operation and cannot execute the testing operation automatically. Therefore, how to improve the testing manner of the touch panel of the electronic system and provides an automatic, fast, convenient and accurate manner to test the electronic system becomes an important topic for the manufacturer to produce the electronic system with the touch panel.

SUMMARY OF THE INVENTION

It is therefore a primary objective of the present invention to provide a testing apparatus and a method for testing 5-wire resistive touch panel of an electronic system which tests the connection between a touch panel and a control module of the electronic system in a fast and automatic manner that can enhance the convenience and the efficiency.

One embodiment of the present invention provides a testing apparatus for testing the 5-wire resistive touch panel of electronic system. The testing apparatus comprises a voltage control unit, a signal control unit, an electronic unit and a determining unit. The voltage control unit is used for generating a first voltage level and a second voltage level. The signal control unit is used for generating a testing signal. The electronic unit coupled to the voltage control unit and the signal control unit is used for generating at least one output signal according to the first voltage level, the second voltage level and the testing signal correspondingly. The determining unit coupled to the voltage control unit, the signal control unit and the electronic unit is used for determining the status of the electronic unit according to the first voltage level, the second voltage level, the testing signal and at least one output signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
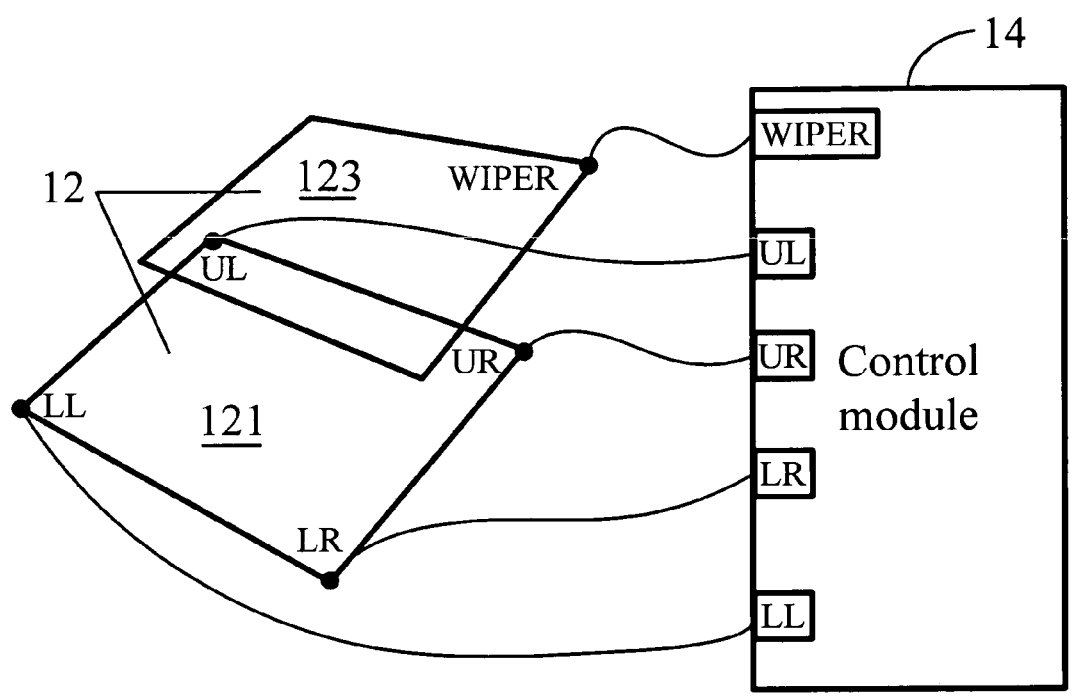
FIG. 1 is a schematic diagram of an electronic system with a 5-wire resistive touch panel.
Figure 2:
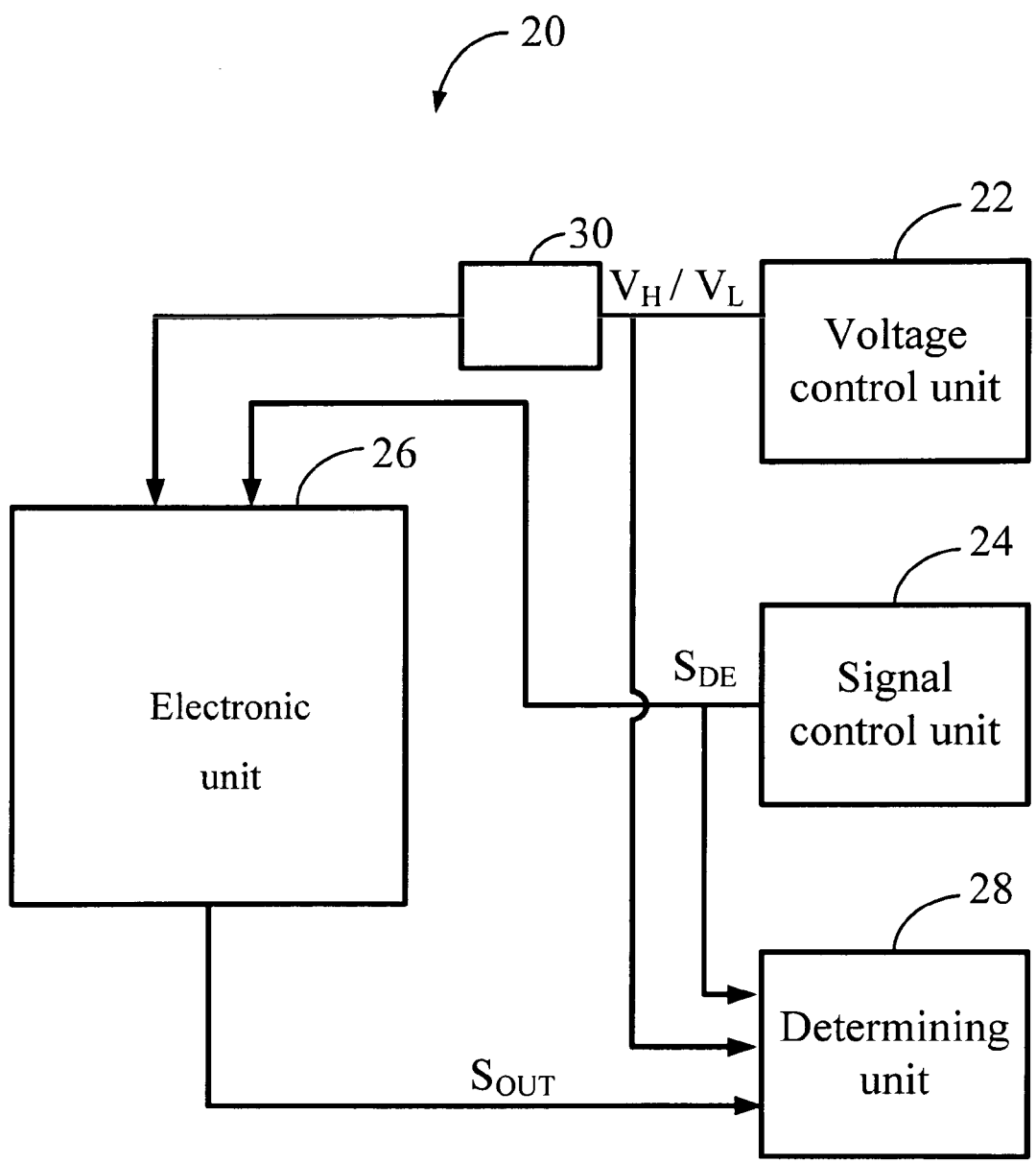
FIG. 2 is schematic diagram of an embodiment of the testing apparatus for testing the 5-wire resistive touch panel of the electronic system according to the present invention.

Please referring to FIG. 2, FIG. 2 is schematic diagrams of an embodiment of the testing apparatus for testing the 5-wire resistive touch panel of the electronic system according to the present invention. As shown in FIG. 2, the present invention is a testing apparatus for testing a 5-wire resistive touch panel of an electronic system 20. The testing apparatus comprises a voltage control unit 22, a signal control unit 24, an electronic unit 26 and a determining unit 28. The voltage control unit 22 is used for generating a first voltage level $V_H$ and a second voltage level $V_L$. In one of the embodiment, the first voltage level $V_H$ is a high voltage level and the second voltage level $V_L$ is a low voltage level. The signal control unit 24 is used for generating a testing signal $S_{DE}$. The electronic unit 26 coupled to the voltage control unit 22 and the signal control unit 24 is used for generating at least one output signal $S_{OUT}$ according to the first voltage level $V_H$, a second voltage level $V_L$ hand the testing signal $S_{DE}$. The determining unit 28 coupled to the voltage control unit 22, signal control unit 24 and the electronic unit 26 is used for determining the status of the electronic unit 26 according to the first voltage level $V_H$, the second voltage level $V_L$, the testing signal $S_{DE}$ and at least one output signal $S_{OUT}$.

Accordingly, the electronic unit 26 is located in the 5-wire resistive touch panel of the electronic system, the electronic unit 26 composed of a plurality of series resistors which is equivalent to the 5-wire resistive touch panel. In one embodiment, the electronic unit 26 includes at least two terminals which are a first terminal used for receiving the testing signal $S_{DE}$ and a second terminal used for generating at least one output signal $S_{OUT}$. The determining unit 28 compares at least one output signal $S_{OUT}$ with the testing signal $S_{DE}$ and determines the status of the electronic unit 26 according to the compared result. The first terminal of the electronic unit 26 is used for receiving the first voltage level $V_H$, the second terminal of the electronic unit 26 is used for receiving the second voltage level $V_L$ and at least one third terminal of the electronic unit 26 is used for generating at least one output signal $S_{OUT}$. The determining unit 28 determines the status of the electronic unit 26 according to at least one output signal $S_{OUT}$, a first predetermined value and a second predetermined value. In this embodiment, the determining unit 28 determines the status of the electronic unit 28 according to whether the voltage level of at least one output signal $S_{OUT}$ falls between the first predetermined value and the second predetermined value or not. If the voltage level of at least one output signal $S_{OUT}$ is within the range, the determining unit 28 determines the electronic unit 26 being normal; otherwise, the determining unit 28 determines the electronic unit 26 being abnormal.

The testing apparatus 20 further comprises at least one connecting unit 30 for controlling a processing terminal WIPER of the electronic unit 26 to receive the first voltage level $V_H$ or the second voltage level $V_L$ selectively, and then causing the electronic unit 26 to generate at least one output signal $S_{OUT}$ according to the first voltage level $V_H$ or the second voltage level $V_L$. Each connecting unit 30 includes a switch SW and a resistor R coupled between the switch SW and the first voltage level $V_H$ or the second voltage level $V_L$.

Figure 3A:
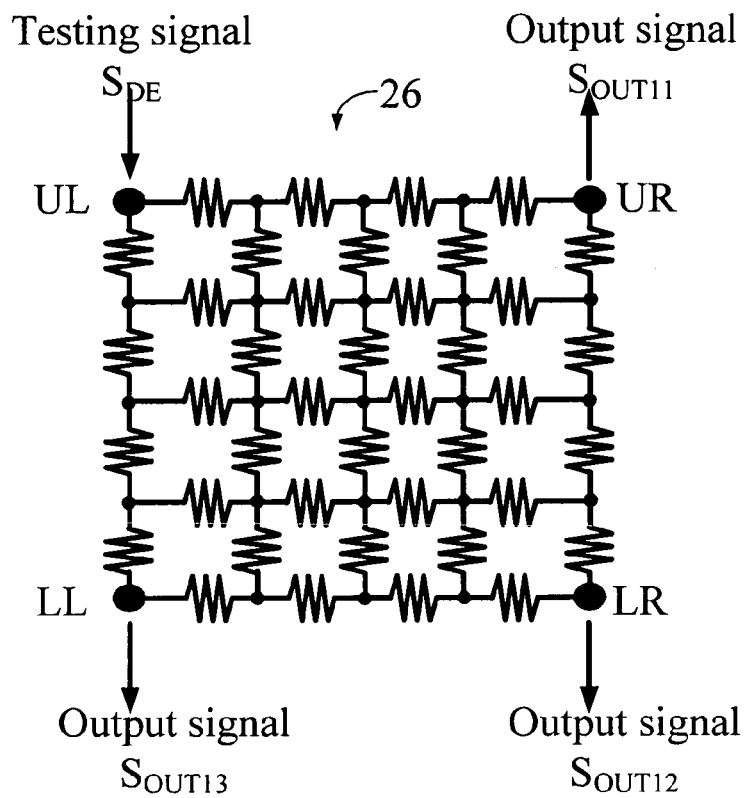
FIGS. 3A and 3B are schematic diagrams of an embodiment of the testing apparatus for testing the 5-wire resistive touch panel of the electronic system under a first test condition according to the present invention.
Figure 3B:
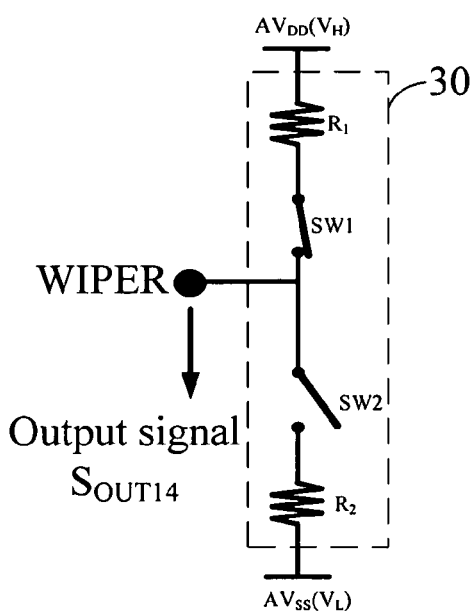

Please referring to FIGS. 3A and 3B, FIGS. 3A and 3B are schematic diagrams of an embodiment of the testing apparatus for testing the 5-wire resistive touch panel of the electronic system under a first test condition according to the present invention. FIGS. 3A and 3B are used for explaining the operation of the testing apparatus 20 utilized in the electronic system with a 5-wire resistive touch panel. The voltage control unit 22, the signal control unit 24 and the determining unit 28 located in a control chip of the touch panel of the electronic system are not shown in those figures in this embodiment. The electronic unit 26 is as shown as the plurality of series resistors as the equivalent circuit of the 5-wire resistive touch panel and the two connecting units 30 of the testing apparatus 20 include control switches SW1 and SW2 and resistors R1 and R2 respectively, wherein the resistor R1 is a pull-up resistor and the resistor R2 is a pull-down resistor. The electronic unit 26 includes 5 terminals which are UY, UL, LR, LL and WIPER respectively. It needs to notice that the terminal WIPER is located on the upper layer of the touch panel for executing signal detecting and the other terminals UR, UL, LR and LL located on the lower layer of the touch panel are used for executing signal receiving respectively.

Please referring to FIGS. 3A and 3B which are used for explaining the first testing condition including the following steps:

1. Transmitting the testing signal $S_{DE}$ to one of the four terminals UR, UL, LR and LL of the touch panel and receiving the output signals $S_{OUT11} \sim S_{OUT13}$ at the other 3 terminals (in this embodiment, the testing signal is transmitted to the terminal UL and the output signals are received from the other 3 terminals UR, LR and LL respectively).
2. Turning on the switch SW1 and turning off the switch SW2 of the connecting unit 30, in this moment, the testing apparatus 20 transmits the direct current (DC) high voltage level $A_{VDD}$ (first voltage level $V_H$) to the terminal WIPER.
3. Measuring and comparing the output signals $S_{OUT11} \sim S_{OUT13}$ generated at the 3 terminals UR, LR, and LL of the touch panel with the testing signal $S_{DE}$. If one of the output signals $S_{OUT11} \sim S_{OUT13}$ is different from the testing signal $S_{DE}$ received at the terminal UL, the determining unit 28 determines the 5-wire resistive touch panel being abnormal, the electronic system disconnected to the 5-wire resistive touch panel, or the manner of the connection is incorrect.
4. Then, measuring and comparing the voltage level of the output signal $S_{OUT14}$ received at the terminal WIPER with the direct current (DC) high voltage level (first voltage level $V_H$). If it is different from the direct current (DC) high voltage level (first voltage level $V_H$), the determining unit 28 determines the 5-wire resistive touch panel being abnormal, the electronic system disconnected to the 5-wire resistor touch panel or the manner of connection is incorrect.
5. If the compared result is that each one of output signals $S_{OUT11} \sim S_{OUT13}$ received from terminals UR, LR, LL respectively is the same as the testing signal $S_{DE}$ and the voltage level of the terminal WIPER is the direct current (DC) high voltage level (first voltage level $V_H$), the determining unit 28 determines the connections between the electronic system and the terminals UL, UR, LR, LL and WIPER are normal to complete the testing operation of the first test condition.

Figure 4A:
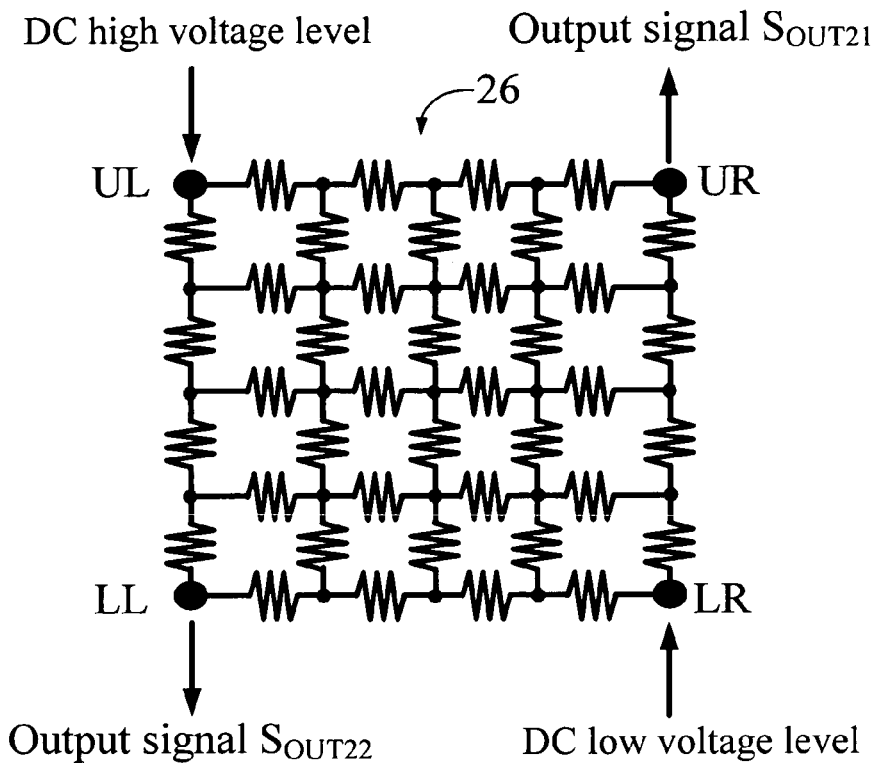
FIGS. 4A and 4B are schematic diagrams of an embodiment of the testing apparatus for testing the 5-wire resistive touch panel of the electronic system under a second test condition according to the present invention.
Figure 4B:
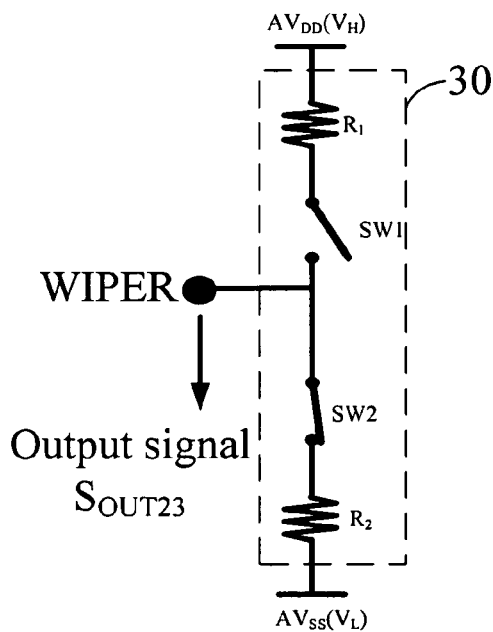

FIGS. 4A and 4B are schematic diagrams of an embodiment of the testing apparatus for testing the 5-wire resistive touch panel of the electronic system under a second test condition according to the present invention. Please refer to the FIGS. 4A and 4B which are used for explaining the operation of the testing apparatus under a second test condition including following steps:

1. Setting one terminal UL of 2 terminals UL, LR which are located on the diagonal of the touch panel to a direct current (DC) high voltage level (first voltage level $V_H$) and setting another terminal LR to a direct current (DC) low voltage level (second voltage level $V_L$), and then measuring the output signals $S_{OUT21}$ and $S_{OUT22}$ of the other two terminals UR, LL of the touch panel respectively, at the same time, turning off the switch SW1 and turning on the switch SW2 of the connecting unit 30.
2. Setting the terminal UL to the direct current (DC) high voltage level (first voltage level $V_H$) and setting the terminal LR to the direct current (DC) low voltage level (second voltage level $V_L$), measuring and comparing the output signal $S_{OUT21}$ and $S_{OUT22}$ of the terminals UR and LL of the touch panel respectively. If the compared result is that one of the output signal $S_{OUT21}$ and $S_{OUT22}$ is between the range of a first predetermined value (high threshold voltage) and the second predetermined value (low threshold voltage), the determining unit 28 determines that the electronic system disconnected to the 5-wire resistive touch panel, the 5-wire resistive touch is abnormal, or the manner of the connection is incorrect. This step can prevent the testing apparatus 20 from executing error test result because of the terminals UL, UR, LR and LL are short to each other. Actually, the resistances of the series resistors are not the same to each other, it may exist drifting error of the manufacturing processes. So this step presets two predetermined values such as the first threshold voltage and the low threshold voltage at first. If both the output signals $S_{OUT21}$ and $S_{OUT22}$ received at the terminals UR and LL are between the high threshold voltage and the low threshold voltage, the determining unit 28 determines the two output signals $S_{OUT21}$ and $S_{OUT22}$ are normal.

3. Measuring and comparing whether the output signal $S_{OUT23}$ received at the terminal WIPER is the same as the direct current (DC) low voltage level (second voltage level) or not, if it is different from the direct current (DC) low voltage level (second voltage level $V_L$), the determining unit 28 determines the electronic system 26 disconnected to the 5-wire resistive touch panel, the 5-wire resistive touch panel is abnormal or the manner of the connection is incorrect. If the output signal $S_{OUT23}$ is the same as the direct current (DC) low voltage level (second voltage level $V_L$), the determining unit 28 determines the terminal WIPER of the 5-wire resistive touch panel is normal.

4. If the output signals $S_{OUT21}$ and $S_{OUT22}$ received at the terminals UR and LL of the touch panel are between the range of the first predetermined value (high threshold voltage) and the second predetermined value (low threshold voltage), and the voltage level of the output signal $S_{OUT23}$ generated at the terminal WIPER is the same as the direct current (DC) low voltage level (second voltage level), the determining unit 28 determines the electronic unit 26 connected to the 5-wire resistive touch panel and the 5-wire resistive touch panel is normal to complete the second test condition.

The direct current (DC) high voltage level (first voltage level $V_L$) and direct current (DC) low voltage level (second voltage level $V_L$) are not limited to specific degrees respectively. In this embodiment and following embodiments, the direct current (DC) high voltage level and the direct current (DC) low voltage level are used for explaining the operation of the testing apparatus 20; furthermore the level degrees of the high voltage level and the low voltage level can be decided by the user for the actual implement situation.

The descriptions of the above two embodiments are used to determine the status of touch panel respectively, a test manner which completes those two test conditions is a preferred embodiment but not limited to every test manner. For example, in one embodiment, if the result of the first test condition shows that the touch panel is abnormal, the test manner is not necessary to execute the test of the second test condition. Furthermore, the sequence of the two test conditions can be changed by the user according to the actual implement situation.

Figure 5:
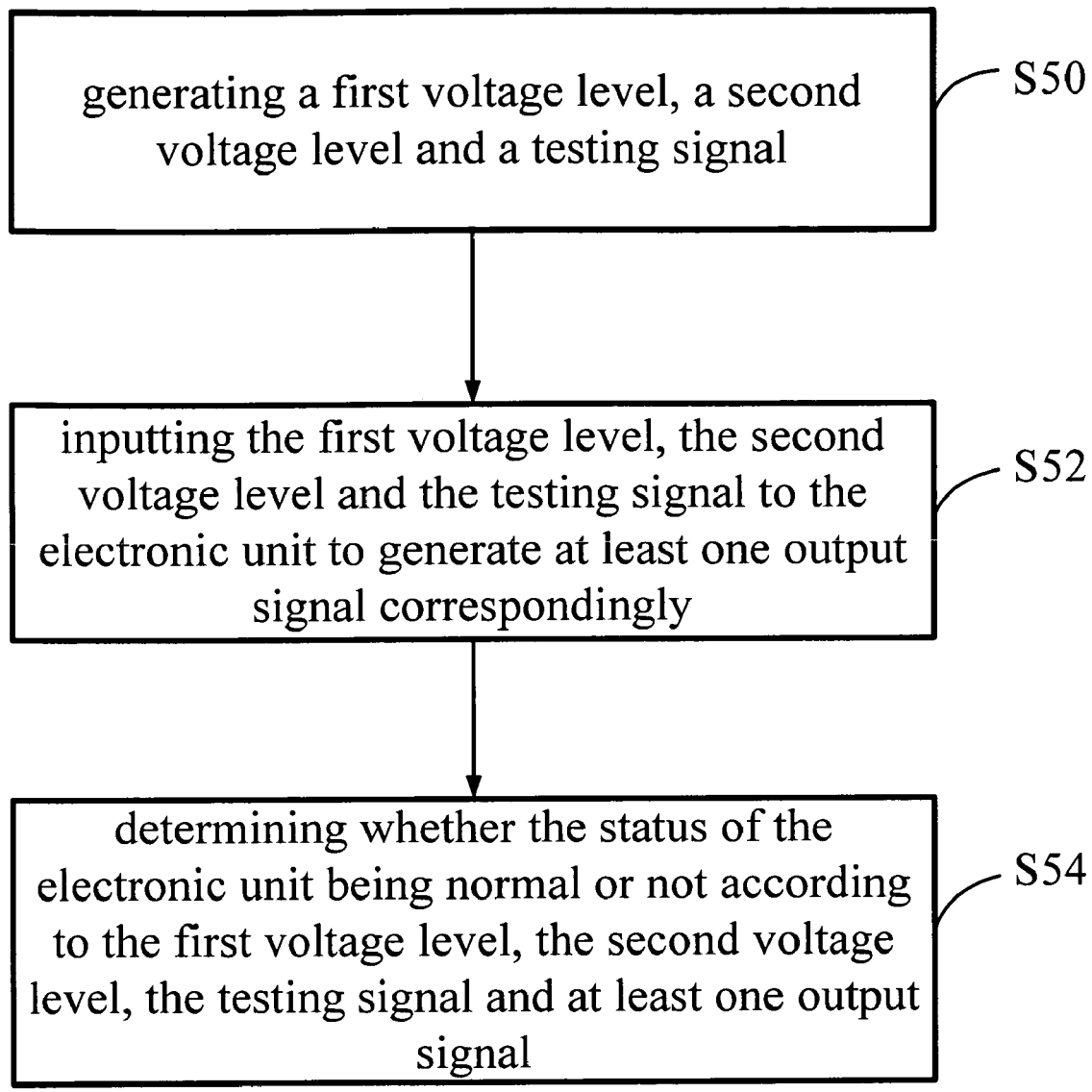
FIG. 5 is a flowchart diagram of an embodiment of the testing method for testing the 5-wire resistive touch panel of the electronic system according to the present invention.

Please referring to FIG. 5, FIG. 5 is a flowchart diagram of an embodiment of the testing method for testing the 5-wire resistive touch panel of the electronic system according to the present invention. As shown in FIG. 5, the present invention provides a testing method for testing the status of an electronic unit of a 5-wire resistive touch panel of an electronic system which comprising the following steps:

Step 50: generating a first voltage level, a second voltage level and a testing signal;

Step 52: inputting the first voltage level, the second voltage level and the testing signal to the electronic unit to generate at least one output signal correspondingly; and Step 54: determining whether the status of the electronic unit being normal or not according to the first voltage level, the second voltage level, the testing signal and at least one output signal. In one embodiment, this step determines the status of the electronic unit according to whether the voltage level of the at least one output signal is between the range of the first predetermined value and the second predetermined value or not correspondingly.

Figure 6A:
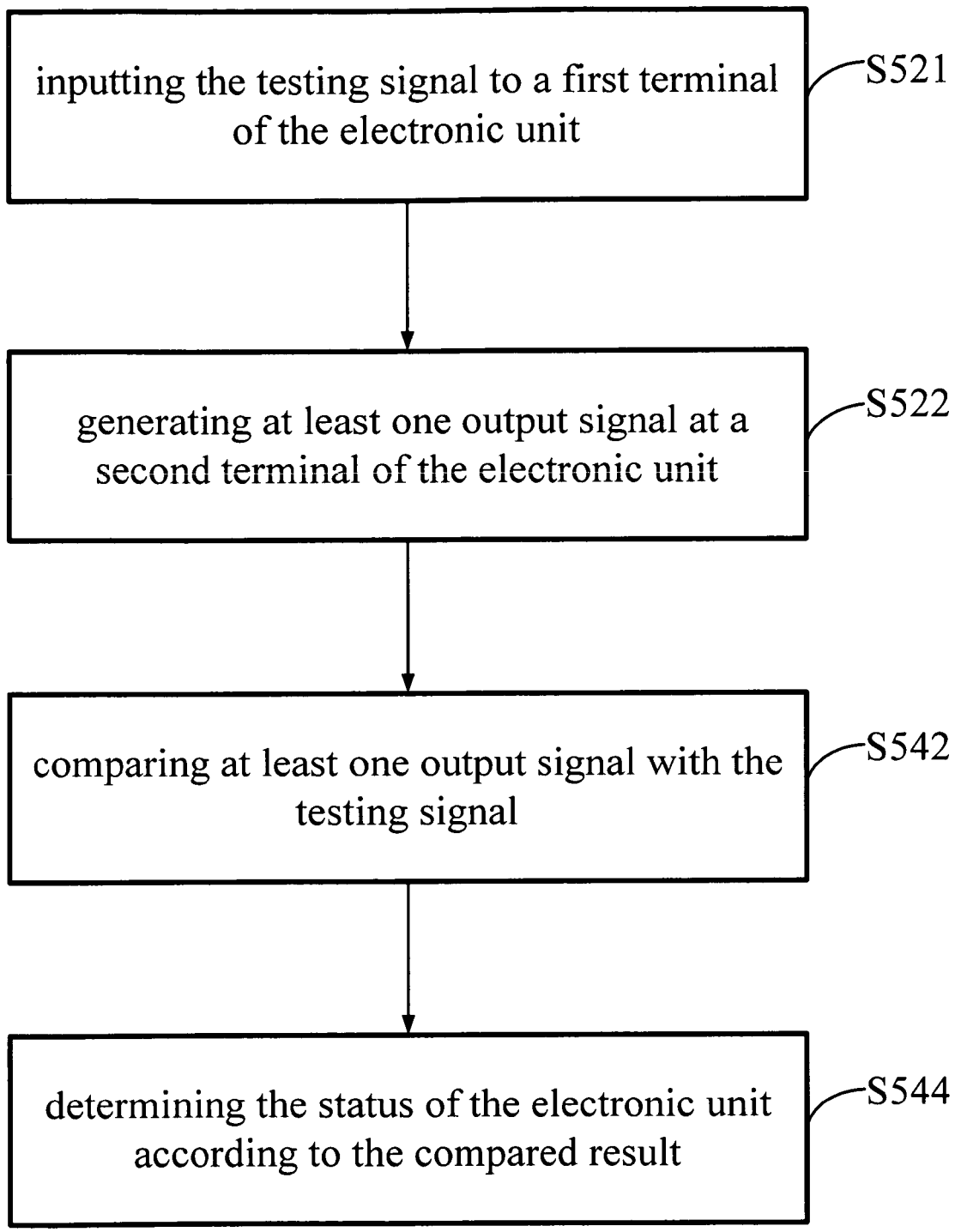
FIGS. 6A and 6B are flowchart diagrams of another embodiment of the testing method for testing the 5-wire resistive touch panel of the electronic system according to the present invention.

Please referring to FIG. 6A, FIG. 6A is flowchart diagram of another embodiment of the testing method for testing the 5-wire resistive touch panel of the electronic system according to the present invention.

In this embodiment, steps S52 and S54 include the following steps respectively:

S521: Inputting the testing signal to a first terminal of the electronic unit; and S522: generating at least one output signal at a second terminal of the electronic unit.

S542: comparing at least one output signal with the testing signal; and

S544: determining the status of the electronic unit according to the compared result.

Figure 6B:
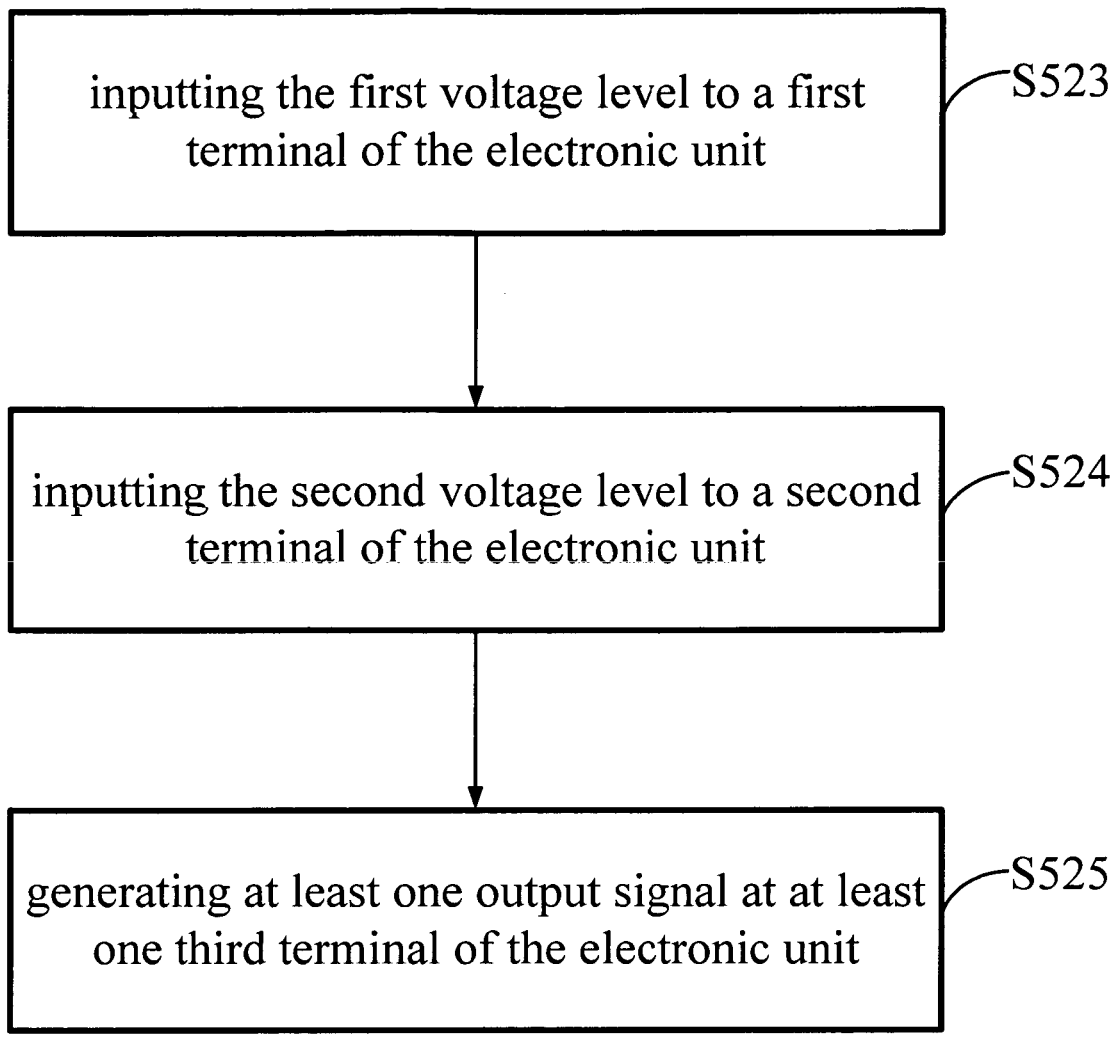

Please referring FIG. 6B, FIG. 6B is flowchart diagram of another embodiment of the testing method for testing the 5-wire resistive touch panel of the electronic system according to the present invention.

In one embodiment, step S52 of the testing method includes the following steps:

S523: inputting the first voltage level to a first terminal of the electronic unit;

S524: inputting the second voltage level to a second terminal of the electronic unit; and S525: generating at least one output signal at least one third terminal of the electronic unit.

The testing method further includes inputting the first voltage level or the second voltage level to the electronic unit to cause the electronic unit generating at least one output signal corresponding to the first voltage level or the second voltage level and then determining the status of the electronic unit according to whether the at least one output signal matches the first voltage level or the second voltage level or not. In one embodiment, the testing method controls inputting the first voltage level or the second voltage level to the electronic unit selectively by a switch. Accordingly, the first voltage level is a high voltage level and the second voltage level is a low voltage level.

As mentioned above, the present invention provides a testing apparatus and method for testing the connection of a 5-wire resistive touch panel which utilizes a voltage control unit and a signal control unit inputting voltage level and further testing signal to the electronic unit automatically. The testing apparatus and a method then utilizes a determining unit to determine the status of the electronic unit according to the output signal of the electronic unit generated corresponding to those voltage levels and the testing signal to complete the test of the electronic unit. Comparing with the test manner in the prior art, the present invention of testing apparatus and a method reduces the manual and further enhances the convenience and the accuration. Accordingly, the descriptions above are the advantages of the testing apparatus and the method for testing a 5-wire resistive touch panel of an electronic system of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A testing apparatus for testing a 5-wire resistive touch panel of an electronic system, comprising:
    a voltage control unit for generating a first voltage level and a second voltage level;
    a signal control unit for generating a testing signal;
    an electronic unit coupled to the voltage control unit and the signal control unit for generating at least one output signal according to the first voltage level, the second voltage level and the testing signal; and
    a determining unit coupled to the voltage control unit, the signal control unit and the electronic unit for determining the status of the electronic unit according to the first voltage level, the second voltage level, the testing signal and the at least one output signal;
    wherein the electronic unit is located in the 5-wire resistive touch panel.

2. The testing apparatus for testing a 5-wire resistive touch panel of an electronic system of claim 1, wherein the electronic unit includes at least two terminals which are a first terminal for receiving the testing signal and a second terminal for generating at least one output signal.

3. The testing apparatus for testing a 5-wire resistive touch panel of an electronic system of claim 2, wherein the determining unit determines the status of the electronic unit according to the result of comparing the at least one output signal with the testing signal.

4. The testing apparatus for testing a 5-wire resistive touch panel of an electronic system of claim 1, wherein the electronic unit includes at least three terminals which are a first terminal for receiving the first voltage level, a second terminal for receiving the second voltage level and at least one third terminal for generating at least one output signal.

5. The testing apparatus for testing a 5-wire resistive touch panel of an electronic system of claim 4, wherein the determining unit determines the status of the electronic unit according to the at least one output signal, a first predetermined value and a second predetermined value.

6. The testing apparatus for testing a 5-wire resistive touch panel of an electronic system of claim 5, wherein the determining unit determines the status of the electronic unit according to whether the voltage level of at least one output signal is between the range of the first predetermined value and the second predetermined value or not.

7. The testing apparatus for testing a 5-wire resistive touch panel of an electronic system of claim 1, wherein the testing apparatus further comprises at least one connecting unit for controlling a processing terminal of the electronic unit to receive the first voltage level or the second voltage level and then cause the electronic unit to generate at least one corresponding output signal according to the first voltage level or the second voltage level.

8. The testing apparatus for testing a 5-wire resistive touch panel of an electronic system of claim 7, wherein every connecting unit of the at least one connecting unit include a switch and a resistor, wherein the resistor is coupled between the switch and the first voltage level or the switch and the second voltage level.

9. The testing apparatus for testing a 5-wire resistive touch panel of an electronic system of claim 7, wherein the first voltage level is a high voltage level and the second voltage level is a low voltage level.

10. A testing method for testing a 5-wire resistive touch panel of an electronic system, the electronic system including an electronic unit, the method testing the status of the electronic unit, the testing method comprising the following steps:
    (a) generating a first voltage level, a second voltage level and a testing signal;
    (b) inputting the first voltage level, the second voltage level and the testing signal to the electronic unit to generate at least one output signal correspondingly; and
    (c) determining the status of the electronic unit according to the first voltage level, a second voltage level, the testing signal and at least one output signal.

11. The testing method for testing a 5-wire resistive touch panel of an electronic system of claim 10, wherein the step (b) comprises following steps:
    (b1) inputting the testing signal to a first terminal of the electronic unit; and
    (b2) generating at least one output signal at a second terminal of the electronic unit.

12. The testing method for testing a 5-wire resistive touch panel of an electronic system of claim 11, wherein the step (c) includes the following steps:
    (c1) comparing at least one output signal with the testing signal; and
    (c2) determining the status of the electronic unit according to the compared result.

13. The testing method for testing a 5-wire resistive touch panel of an electronic system of claim 10, wherein the step (b) includes the following steps:
    (b3) inputting the first voltage level to a first terminal of the electronic unit;
    (b4) inputting the second voltage level to a second terminal of the electronic unit; and
    (b5) generating at least one output signal at least one third terminal of the electronic unit.

14. The testing method for testing a 5-wire resistive touch panel of an electronic system of claim 13, wherein the step (c) determines the status of the electronic unit according to at least one output signal, a first predetermined value and a second predetermined value.

15. The testing method for testing a 5-wire resistive touch panel of an electronic system of claim 14, wherein the step (c) determines the status of the electronic unit according to whether the voltage level of the at least one output signal is between the range of the first predetermined value and the second predetermined value or not.

16. The testing method for testing a 5-wire resistive touch panel of an electronic system of claim 10, wherein the method comprises: inputting the first voltage level or the second voltage level to the electronic unit and generating at least one output signal correspondingly.

17. The testing method for testing a 5-wire resistive touch panel of an electronic system of claim 16, wherein the first voltage level is a high voltage level and the second voltage level is a low voltage level.

* * * * *